US006680618B1

(12) United States Patent
Otani et al.

(10) Patent No.: US 6,680,618 B1
(45) Date of Patent: Jan. 20, 2004

(54) LEAK SENSING SWITCH

(75) Inventors: Kazuya Otani, Niwa-gun (JP); Yuji Takasu, Niwa-gun (JP); Mitsuo Mori, Niwa-gun (JP)

(73) Assignee: Kabushiki Kaisha Tokai Rika Denki Seisakusho (JP)

( * ) Notice: Subject to any disclaimer, the term of this patent is extended or adjusted under 35 U.S.C. 154(b) by 0 days.

(21) Appl. No.: 10/088,132

(22) PCT Filed: Sep. 6, 2000

(86) PCT No.: PCT/JP00/06039

§ 371 (c)(1),
(2), (4) Date: Mar. 13, 2002

(87) PCT Pub. No.: WO01/20354

PCT Pub. Date: Mar. 22, 2001

(30) Foreign Application Priority Data

Sep. 14, 1999 (JP) .................................. 11/260293

(51) Int. Cl.$^7$ ............................................. G01R 27/08
(52) U.S. Cl. ........................ 324/693; 324/537; 340/602; 200/61.04

(58) Field of Search .................. 340/545.6, 545.4, 340/602–605; 200/61.04, 61.05, 81 R, 81.6, 182, 193; 324/503, 511, 537, 693, 694

(56) References Cited

FOREIGN PATENT DOCUMENTS

| JP | 11-141231 | 5/1999 |
| JP | 11-194107 | 7/1999 |

*Primary Examiner*—N. Le
*Assistant Examiner*—Vincent Q. Nguyen
(74) *Attorney, Agent, or Firm*—Synnestvedt & Lechner LLP

(57) ABSTRACT

A low-cost leak sensor that prevents leakage current from flowing between electrodes when moisture is deposited. A leak sensor is formed on an insulating substrate. The leak sensor has a through hole having a pair of opposed walls with a predetermined space. The opposed walls are provided with conducting films. On the opening of the through hole in the insulating substrate, a pair of lands are connected electrically with the pair of conducting films. A pair of wiring patterns are connected electrically with the pair of lands on the insulating substrate.

10 Claims, 3 Drawing Sheets

LEAK SENSING SWITCH

BACKGROUND OF THE INVENTION

The present invention relates to a leak sensing switch for detecting a leakage current and an insulating substrate having a leak sensing switch.

Power window apparatuses are used to automatically open and close the window glass panels of side doors or the like of vehicles. The window glass panels are elevated or lowered when a driver operates an up switch or a down switch of the power window apparatus. However, if the power window apparatus is immersed in water, a drive circuit for the drive motors of the power window apparatus tends to malfunction, failing to energize the drive motors. To solve the above problem, th drive circuit of the power window apparatus is provided with a leak sensing switch for detecting a leakage current. When the leak sensing switch detects a leakage current at the time the power window apparatus is immersed in water, the drive circuit becomes operational based on the detection of the leakage current.

FIG. 5 is a schematic plan view of a first conventional leak sensing switch 50. A pair of pattern wirings 52a, 52b extend parallel to each other on a circuit board 51, and first and second branch wirings 53a, 53b extending perpendicularly to the pattern wirings are disposed between the pattern wirings. Electrodes 54a, 54b produced by soldering are disposed respectivelyon the first and second branch wirings 53a, 53b. The electrodes 54a, 54b have a given length 11, and are spaced from each other by a predetermined gap g1. When the leak sensing switch 50 is immersed in water, a leakage current flows between the electrodes 54a, 54b, thus detecting the immersion in water.

FIG. 6 is schematic plan view of a second conventional leak sensing switch 55. A pair of pattern wirings 57a, 57b extend in series and is spaced from each other in a predetermined space on a circuit board 56, a C-shaped first electrode support 58a connected to the pattern wiring 57a and a circular second electrode support 58b connected to the pattern wiring 57b disposed between the pattern wirings 57a, 57b. The first electrode support 58a is spaced from the second electrode support 58b by a predetermined gap g2 and is disposed to surround the second electrode support 58b. Electrodes 59a, 59b produced by soldering are disposed respectively on the first and second electrode supports 58a, 58b.

FIG. 7 is a schematic perspective view of a third conventional leak sensing switch 60. A base 62 of synthetic resin having insulating properties is disposed on a circuit board 61, and a pair of parallel electrode pins 63a, 63b are disposed on the base 62. The electrode pins 63a, 63b are electrically connected to a wiring pattern, not shown. The electrode pins 63a, 63b have a given length 13, and are spaced from each other bya predetermined gap g3.

When the difference between the temperature within the power window apparatus and the temperature outside the power window apparatus increases, moisture tends to be condensed in the power window apparatus, disadvantageously.

With the leak sensing switches 50, 55 shown in FIGS. 5 and 6, when water droplets are produced between the electrodes 54a, 54b and between the electrodes 59a, 59b due to dew condensation, a leakage current may flow between the electrodes 54a, 54b and between the electrodes 59a, 59b and may be detected even though the power window apparatus is not immersed in water.

With the leak sensing switch 60 shown in FIG. 7, however, since the electrode pins 63a, 63b are not disposed on a plane, the possibility of a leakage current flowing between the electrodes 63a, 63b due to dew condensation is low. However, the cost of manufacture of the leak sensing switch is increased because its production needs a manual process for the worker to insert the electrode pins 63a, 63b into the base 52.

BRIEF SUMMARY OF THE INVENTION

It is an object of the present invention to provide a leak sensing switch which prevents a leakage current from flowing between electrodes due to dew condensation and manufacturing cost from increasing.

According to a first aspect of the present invention, there is provided a leak sensing switch formed on an insulating substrate. The leak sensing switch is formed on an insulating substrate and has a through hole defined in the insulating substrate and having a pair of inner side surfaces opposing each other across a predetermined space. A pair of conducting films are disposed respectively on the inner side surfaces. A pair of lands electrically connected to the conducting films, respectively are disposed on peripheral edges of the opening of the through hole in the insulating substrate. A pair of wiring patterns electrically connected to the pair of lands, respectively, are disposed on the insulating substrate.

According to a second aspect of the present invention, there is provided an insulating substrate having a leak sensing switch disposed thereon. The leak sensing switch is formed on an insulating substrate and has a through hole defined in the insulating substrate and having a pair of inner side surfaces opposing each other across a predetermined space. A pair of conducting films are formed respectively on the inner side surfaces. A pair of lands electrically connected to a pair of conducting films, respectively are disposed on peripheral edges of the opening of the through hole in the insulating substrate. A pair of wiring patters electrically connected to the pair of lands, respectively, are disposed on the insulating substrate.

DETAILED DESCRIPTION OF THE PREFERRED EMBODIMENTS

BEST MODE FOR CARRYING OUT THE INVENTION

A leak sensing switch mounted in a power window apparatus according to an embodiment of the present invention will be described below with reference to FIGS. 1 through 4.

Figure 1:
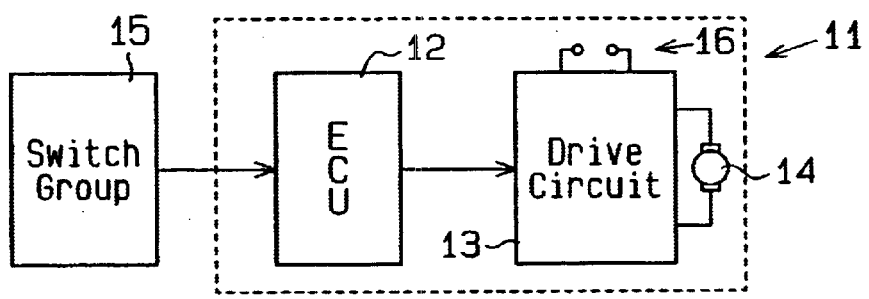
FIG. 1 is a schematic block diagram of a power window apparatus according to an embodiment of the present invention.

FIG. 1 is a schematic block diagram of a power window apparatus 11.

The power window apparatus 11 has an electronic control unit (ECU) 12, a drive circuit 13, and a drive motor 14.

The ECU 12 has input terminals to which connected a switch group 15 including a down switch, an up switch, and an automatic switch. The ECU 12 has an output terminal connected to the drive circuit 13. The drive motor 14 for elevating or lowering a window glass panel of a vehicle, not shown, is connected to the drive circuit 13. The drive motor 14 preferably comprises a DC motor.

Each of the down and up switches comprises a double-click tumbler switch. When a down knob or an up knob of the switch is pressed one click, it supplies a down signal or an up signal to the ECU 12. In resposne to the down signal or the up signal, the ECU 12 supplies a drive signal to the drive circuit 13 which energizes the drive motor 14 to lower or elevate the window glass panel. When the down knob or the up knob of the switch is pressed two clicks, it supplies the down signal or the up signal and also an automatic signal to the ECU 12. In response to the automatic signal, the ECU 12 supplies a drive signal to the drive circuit 13 which energizes the drive motor 14 until the window glass panel reaches a fully closed position or a fully open position. A leak sensing switch 16 is connected to the drive circuit 13. The leak sensing switch 16 detects a leakage current when the power window apparatus 11 is immersed in water.

Figure 2:
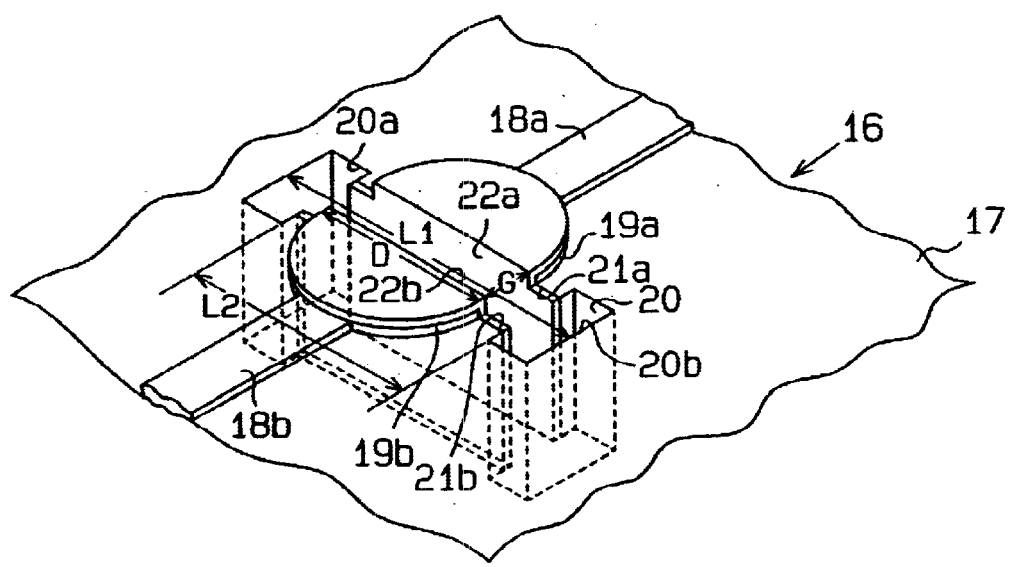
FIG. 2 is a schematic perspective view of a leak sensing switch according to an embodiment of the present invention.

As shown in FIG. 2, the leak sensing switch 16 is disposed on a circuit board 17 of the drive circuit 13. The circuit board 17 is disposed in a location free from exposure to rainwater, such as a passenger compartment, an engine compartment, a trunk, or the like of a vehicle. A first pattern wiring 18a and a second pattern wiring 18b spaced a predetermined distance from each other are disposed in line with each other on the circuit board 17. The first and second pattern wirings 18a, 18b are electrically connected to other wiring patterns (not shown). The pattern wirings 18a, 18b have opposite ends on which semicircular lands 19a, 19b are formed. The lands 19a, 19b have respective linear edges (chordal edges) disposed in opposing relation to each other. The linear edges of the lands 19a, 19b lie parallel to each other. The pattern wirings 19a, 19b and the lands 19a, 19b are formed of plated copper films on the circuit board 17. The lands 19a, 19b are electrically connected to the pattern wirings 19a, 19b, respectively.

Figure 3:
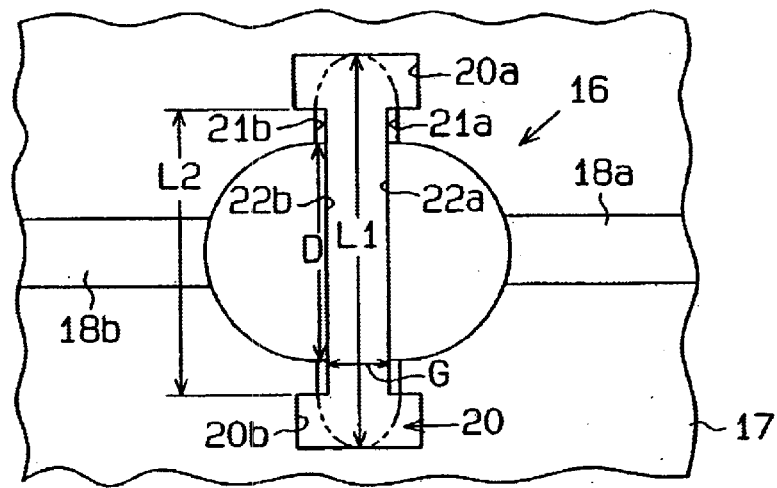
FIG. 3 is a schematic plan view of the leak sensing switch shown in FIG. 2.

A through hole 20 is formed in the circuit board 17 between the lands 19a, 19b. As shown in FIG. 3, the through hole 20 has an I-shaped (slender) opening having opposing surfaces 21a, 21b parallel to each other. The through hole 20 has a length L1 greater than the diameter D of the lands 19a, 19b. The opposing surfaces 21a, 21b have a length L2 which is also greater than the diameter D.

Figure 4:
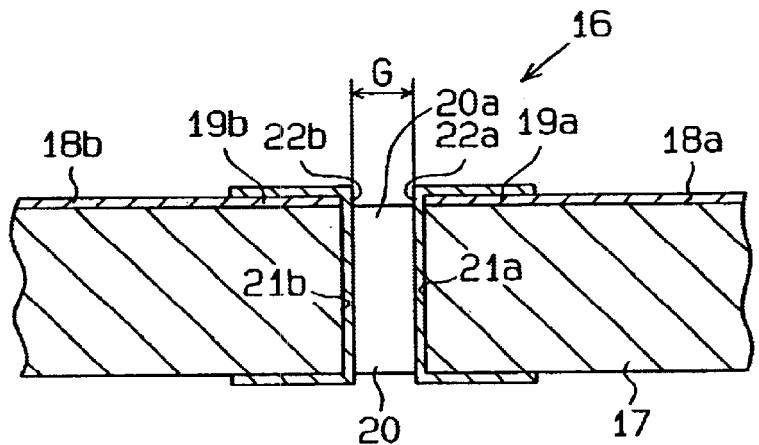
FIG. 4 is a schematic cross-sectional view of the leak sensing switch shown in FIG. 2.
Figure 5:
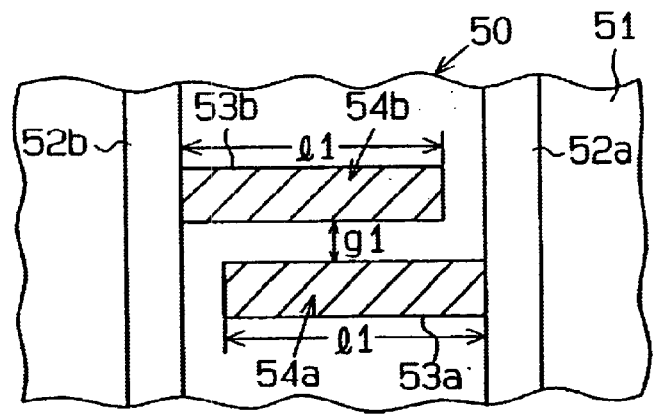
FIG. 5 is a schematic plan view of a first conventional leak sensing switch.
Figure 6:
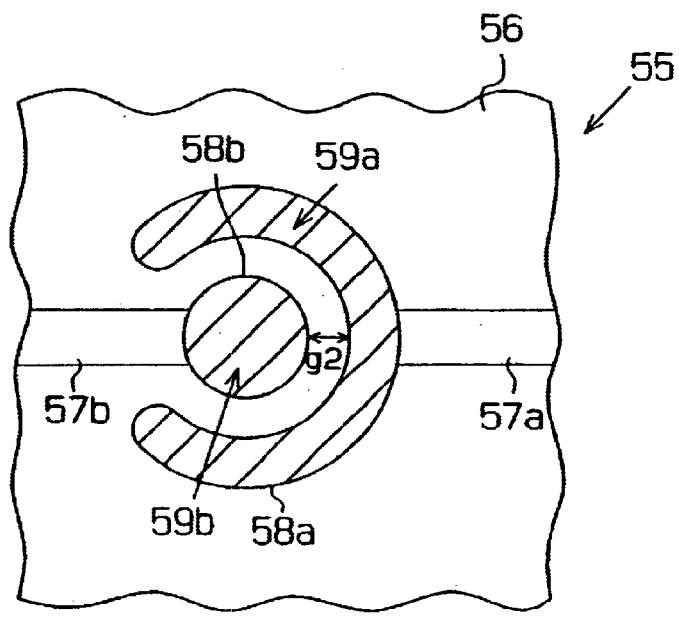
FIG. 6 is a schematic plan view of a second conventional leak sensing switch.
Figure 7:
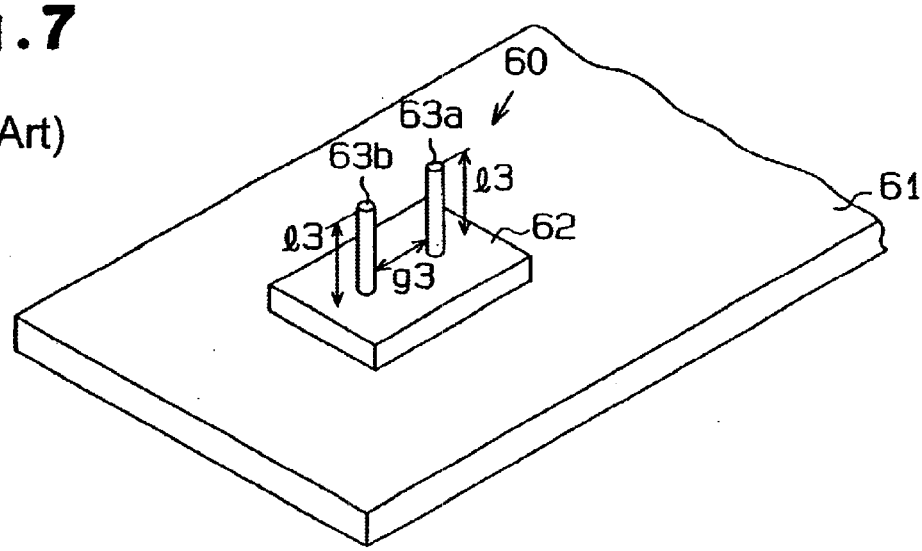
FIG. 7 is a schematic plan view of a third conventional leak sensing switch.

As shown in FIG. 4, first and second electrodes 22a, 22b are formed in the through hole 20. The first and second electrodes 22a, 22b comprise plated copper films extending from upper surfaces of the lands 19a, 19b over the opposing surfaces 21a, 21b to cover a part of the back surfaces of the circuit board 17. The first and second electrodes 22a, 22b are disposed fully o the opposing surfaces 21a, 21b. The first and second electrodes 22a, 22b are electrically connected to the lands 19a, 19b. The first and second electrodes 22a, 22b are formed as follows: First, as indicated by the two-dot-and-dash lines in FIG. 3, a through hole 20 having an oblong shape is for in the circuit board 17, and then a plated copper film is deposited on the entire inner surface of the through hole 20. Thereafter, wide holes 20a, 20b are defined in the circuit board 17 at the opposite ends of through hole 20, and the first and second electrodes 22a, 22b are formed only on the opposing surfaces 21a, 21b.

A predetermined gap G is present between the electrodes 22a, 22b. The gap G and the through hole length L1 are set at values large enough provide an insulating distance between the first and second electrodes 22a, 22b and allow a leakage current to flow between the first and second electrodes 22a, 22b when the power window apparatus is immersed in water.

The through hole 20, the lands 19a, 19b, and the electrodes 22a, 22b are formed at the same time that wiring patterns of the drive circuit 13, other lands, and other through holes for inserting component terminals, not shown, are formed.

Operation of the leak sensing switch 16 will be described below.

When the power window apparatus 11 is not immersed in water, but moisture is condensed in the power window apparatus 11 due to the difference between the temperature within the power window apparatus 11 and the temperature outside the power window apparatus 11, water droplets are deposited on the first and second electrodes 22a, 22b of the leak sensing switch 16. At this time, since the electrodes 22a, 22b do not lie on the same plane, and are spaced apart by the gap G across the through hole 20, the water droplets flow down the electrodes 22a, 22b or remain retained on the electrodes 22a, 22b. Therefore, no leak current flows between the electrodes 22a, 22b through the water droplets.

When the power window apparatus 11 is immersed in an electrolytic liquid such as rainwater, water enters the through hole 20 in the leak sensing switch 16, causing a leakage current to flow between the first and second electrodes 22a, 22b. Since the opening area of the through hole 20 is relatively large, the water surely finds its way into the through hole 20. Furthermore, because the first and second electrodes 22a, 22b face each other and are disposed fully over the entire opposing surfaces 21a, 21b, the leakage current flows effectively between the first and second electrodes 22a, 22b, so that the immersion of the power window apparatus 11 in water can reliably be detected. When the leakage current flows between the electrodes 22a, 22b, the drive circuit 13 does not malfunction based on the detection of the leakage current, and keeps the drive motor 14 operable.

The leak sensing switch 16 according to the present embodiment offers the following advantages:

(1) Since the first and second electrodes 22a, 22b are formed in the through hole 20 so as to oppose each other across the predetermined space, no leakage current flows between the electrodes 22a, 22b even when moisture is condensed in the power window apparatus 11.

(2) The manufacturing cost of the power window apparatus 11 is not increased because the through hole 20, the first and second electrodes 22a, 22b, and the lands 19a, 19b are formed in the same process as wiring patterns of the drive circuit 13, other lands, and other through holes.

(3) Since the opening area of the through hole 20 is relatively large, water surely enters the through hole 20, allowing a leakage current to be detected reliably.

(4) As the first and second electrodes 22a, 22b are disposed parallel to each other, the distance between them is kept constant, allowing a leakage current to be detected reliably.

(5) The length L2 of the opposing surface 21a, 21b is greater than the diameter D of the lands 19a, 19b, and the electrodes 22a, 22b are disposed fully over the opposing surfaces 21a, 21b. Consequently, the are for detecting a leakage current when the power window apparatus 11 is immersed in water is relatively large, allowing a leakage current to be detected reliably.

The above embodiment may be modified as follows:

(a) The through hole 20 may be formed in a circular shape as well as in an oblong shape.

(b) The width of the first and second electrodes 22a, 22b may be the same as or smaller than the diameter D of the lands 19a, 19b.

(c) The first and second electrodes 22a, 22b may be formed only on the opposing surfaces 21a, 21b. In this case, the first and second electrodes 22a, 22b need to be electrically connected to the lands 19a, 19b.

(d) The leak sensing switch 16 may be provided in not only the drive circuit 13 of the power window apparatus 11, but also other drive circuits.

(e) The leak sensing switch 16 may be used in other devices where the circuit board 17 is liable to be immersed in another electrolytic solution.

(f) A circuit board having the leak sensing switch 16 may be provided separately from the circuit board of the drive circuit 13.

What is claimed is:

1. A leak sensing switch formed on an insulating substrate, comprising:
    a through hole formed in the insulating substrate and having a pair of inner side surfaces opposing each other across a predetermined space;
    a pair of conducting films formed respectively on the inner side surfaces;
    a pair of lands disposed on peripheral edges of the opening of the through hole in the insulating substrate and electrically connected to the conducting films, respectively; and
    a pair of wiring patterns disposed on the insulating substrate and electrically connected to the lands, respectively.

2. The leak sensing switch according to claim 1, for use as a for detecting when a power window apparatus is immersed in water.

3. The leak sensing switch according to claim 1, wherein the through hole has an elongate shape, the inner side surfaces include a pair of opposing surfaces confronting each other and extending parallel to each other, and the pair of conducting films are formed respectively on the pair of opposed surfaces.

4. The leak sensing switch according to claim 3, wherein the pair of conducting films are formed entirely on the pair of opposing surfaces.

5. The leak sensing switch according to claim 3, wherein the length of each of the opposing surfaces is greater than the diameter of each of the lands.

6. An insulating substrate comprising:
    a leak sensing switch formed on the insulating substrate, the leak sensing switch including
        a through hole formed in the insulating substrate and having a pair of inner side surfaces opposing each other across a predetermined space,
        a pair of conducting films formed respectively on the inner side surfaces,
        a pair of lands disposed on peripheral edges of the opening of the through hole in the insulating substrate and electrically connected to the conducting films, respectively, and
        a pair of wiring patterns disposed on the insulating substrate and electrically connected to the lands, respectively.

7. The insulating substrate according to claim 6, for use as a board in a drive circuit of a power window apparatus.

8. The insulating substrate according to claim 6, wherein the through hole has an elongate shape, the pair of inner side surfaces include a pair of opposing surfaces confronting each other and extending parallel to each other, and the pair of conducting films are formed respectively on the pair of opposing surfaces.

9. The insulating substrate according to claim 8, wherein the pair of conducting films are formed entirely on the pair of entire opposing surfaces.

10. The insulating substrate according to claim 8, wherein the length of each of the opposing surfaces is greater than the diameter of each of the lands.

* * * * *

UNITED STATES PATENT AND TRADEMARK OFFICE
CERTIFICATE OF CORRECTION

PATENT NO. : 6,680,618 B1
DATED : January 20, 2004
INVENTOR(S) : Kazuya Otani, Yuji Takasu and Mitsuo Mori It is certified that error appears in the above-identified patent and that said Letters Patent is hereby corrected as shown below:

<u>Column 5,</u>
Line 45, insert -- sensor -- between "a" and "for".

Signed and Sealed this

Twenty-third Day of March, 2004

JON W. DUDAS
*Acting Director of the United States Patent and Trademark Office*